US005581251A

United States Patent [19]

McRight et al.

[11] Patent Number: 5,581,251

[45] Date of Patent: Dec. 3, 1996

[54] HIGH VISIBILITY LIGHTPIPE IN CLOSE PROXIMITY TO FUNCTION KEY

[75] Inventors: William McRight, Round Rock; David Bryant, Austin; Wayne McKinnon, Georgetown, all of Tex.

[73] Assignee: Rolm Systems, Santa Clara, Calif.

[21] Appl. No.: 422,686

[22] Filed: Apr. 13, 1995

Related U.S. Application Data

[63] Continuation of Ser. No. 216,237, Mar. 22, 1994, abandoned, which is a continuation of Ser. No. 903,469, Jun. 25, 1992, abandoned.

[51] Int. Cl.[6] .................................................. H03K 17/94

[52] U.S. Cl. .............................................. 341/22; 200/314

[58] Field of Search .................. 341/22, 23; 340/815.42, 340/815.53, 815.54, 815.74; 200/5 A, 300, 314, 317, DIG. 2, DIG. 47

[56] References Cited

U.S. PATENT DOCUMENTS 4,531,034 7/1985 Inaba .................................... 200/314
4,773,090 9/1988 Goatman ................................ 200/5 A X
4,845,319 7/1989 Watkins et al. ........................ 200/5 A
4,924,044 5/1990 Takahashi et al. ..................... 200/314
5,184,116 2/1993 Daugherty et al. ..................... 340/764

FOREIGN PATENT DOCUMENTS 2140210 11/1984 United Kingdom .

*Primary Examiner*—Thomas Mullen

[57] ABSTRACT

A lighted keyboard system which transmits light to the viewer via a clear rectangular column that uses the function key's guiding mechanism for support. The lightpipe emits light in a uniformly brilliant rectangle of light from a height above the surface of the keyboard. The lightpipe gathers light from an external light source which emits light at a wide viewing angle, and directs the emitted light along the center of the lightpipe to the emitting section. The beam of light is then diffused by the emitting section located at the top of the lightpipe, becoming a uniformly brilliant rectangle. The function key has a wide base which is used to guide the function key as it travels. This wide base never extends above the surface of the keyboard thereby maintaining all contacting surfaces between the guiding features and the function key below the surface of the keyboard. The function key has a key push center which is offset from the base of the function key. The associated guiding mechanism works in conjunction with the wide base to eliminate the moments produced when the function key is pressed at a point which is not over the base of the function key. The function key then moves smoothly until it is stopped by a stopping arm located on its associated lightpipe.

17 Claims, 6 Drawing Sheets

HIGH VISIBILITY LIGHTPIPE IN CLOSE PROXIMITY TO FUNCTION KEY

CROSS-REFERENCE TO RELATED APPLICATIONS

This is a continuation of Ser. No. 08/216,237 filed on Mar. 22, 1994, abandoned which is a continuation of Ser. No. 07/903,469 filed on Jun. 25, 1992, abandoned

BACKGROUND OF THE INVENTION

1. Technical Field

This invention relates generally to keyboards, and, more particularly, to keyboards with indicators.

2. Related Art

Function keys, also called pushbuttons, are standard parts for many types of electronic equipment. Typically, the function keys are plastic parts used to push down on a dome in a rubberized keypad which covers the printed circuit board. A conductive area is present on the reverse side of the keypad. Pushing the key causes the conductive area to touch a printed circuit board, making a connection between two contact points that are normally not connected.

A light emitting diode (LED) is a common source of light for electronic indicators. Lightpipes are often used to conduct LED-produced light from the circuit board to the viewing area. One end of the lightpipe covers the LED and the other end constitutes the indicator, as perceived by the viewer. The lightpipe gathers light emitted from the LED at a wide viewing angle, and transfers the light as a narrow beam of light along the lightpipe to the indicator. Conventional lightpipes are flush with the device surface, commonly referred to as a keyboard, resulting in light which is emitted with a narrow viewing angle perpendicular to the surface of the keyboard. This results in the emitted light not being noticeable until the user is in close proximity to the device. Also, the view of the lightpipe is obstructed by function keys which are raised off the surface of the keyboard.

Lightpipes are usually separated from their associated function keys by the structural supports and guides for the lightpipe and the function key. As a result, it is sometimes not clear which lightpipes are associated with which function keys, especially when there are numerous lightpipes and function keys on a keyboard. Also, the keyboard space which exists between the separated lightpipes and the associated function keys is unusable, thereby reducing the amount of functions which can be supported by a keyboard of a given size.

There have been a number of conventional techniques implemented to overcome these problems. One has been to include the use of additional labeling or markings to clarify the association between the lightpipes and the function keys. This technique overcomes the problem of association but does not rectify the loss of functional space on the surface of the keyboard. In addition, there are extra costs associated with the production of keyboards with labels or markings.

A second solution includes associating the function key to the lightpipe by arrangement; that is, creating a line of keys and a line of lightpipes that have the same center to center spacing. A third technique has been to use thin support mechanisms so that the two elements may be as close together as possible. Though these two solutions have reduced the amount of unusable space, they have not eliminated it.

A fourth solution has been to install the LED or light source inside or near a transparent or translucent function key. This solution sets limits on the key's compactness and may allow the user unwanted glimpses of the product's inner circuitry. Another drawback of this solution is that transparent or translucent material is more costly than opaque material.

In addition to these problems, a conventional function key typically has a constant diameter along the length of its shaft. The function key is guided by a guiding mechanism which comes into contact with the part of the shaft which extends below the surface of the keyboard when the function key is depressed. The function key carries any contamination it is exposed to above the surface of the keyboard to below the surface when the function key is depressed. The contamination then interferes with the operation of the function key.

Also, there are limitations on the arrangement of conventional function keys in their relation to the key pad dome that they are to control. A conventional function key is typically positioned directly over the keypad dome that it controls to transfer the applied force down through the center of the function key to the key pad dome. The area to apply force which results in the function key moving smoothly within its guiding mechanism is referred to as the key push center.

Conventional function keys have a key push center located at the center of the face of the function key. Applying pressure at a point on the function key outside this area results in the function key twisting rather that moving in its guiding structure. This has limited the possible arrangements of the function key and its associated lightpipe with the LED and contact switch on the circuit board.

What is needed is a lightpipe and function key arrangement that o are adjacent to each other to eliminate the need for marking and labeling on the upper surface of the keyboard. The function key and lightpipe need to be as close as possible, reducing the amount of lost surface area on the keyboard. The lightpipe needs to produce uniformly brilliant light from a height which will result in the light not being obstructed by its associated function key. In addition, the lightpipe needs to emit light at a wide viewing angle to be visible from any position.

SUMMARY OF THE INVENTION

The present invention provides a lighted keyboard system which has a lightpipe that emits light in a uniformly brilliant rectangle placed adjacent to its associated function key. The function key and the lightpipe use the same support mechanism, eliminating the unusable space located between the lightpipe and function key. This eliminates the need for additional markings or labeling to identify the function key with which each lightpipe is associated. The lightpipe gathers light from an LED which emits light at a wide viewing angle, and directs the emitted light along the center of the lightpipe to an emitting section. The beam of light is then diffused by the emitting section located at the top of the lightpipe, becoming a uniformly brilliant rectangle. The light which is emitted by the lightpipe is at a height which is above the surface of the keyboard. The view of the indication is no longer obstructed due to the positioning of the lightpipe relative to the function key or the height of the lightpipe. Additionally, the uniformly brilliant rectangle has a wide viewing angle.

The function key has a wide base which is used to guide the function key as it travels. Only the wide base of the function key, which never extends above the surface of the keyboard, comes into contact with the guiding mechanisms. Since all contacting surfaces between the wide base and the guiding mechanism remain below the surface of the keyboard, interference with function key movement due to contamination is eliminated.

The function key has a key push center which is offset from the base of the function key. The associated guiding mechanism works in conjunction with the wide base to eliminate the moments produced when the function key is pressed at a point which is not directly over the base of the function key. The function key then moves smoothly until it is stopped by a stopping arm located on its associated lightpipe. This enables the user to operate the function key successfully by pressing down on any portion of its surface.

BRIEF DESCRIPTION OF DRAWINGS

The foregoing and other features and advantages of the invention will be apparent from the following more particular description of preferred embodiments of the invention, as illustrated in the accompanying drawings, in which.

DETAILED DESCRIPTION OF THE INVENTION

The preferred embodiment of the present invention is now described with reference to the figures where like reference numbers refer to like elements.

Figure 1:
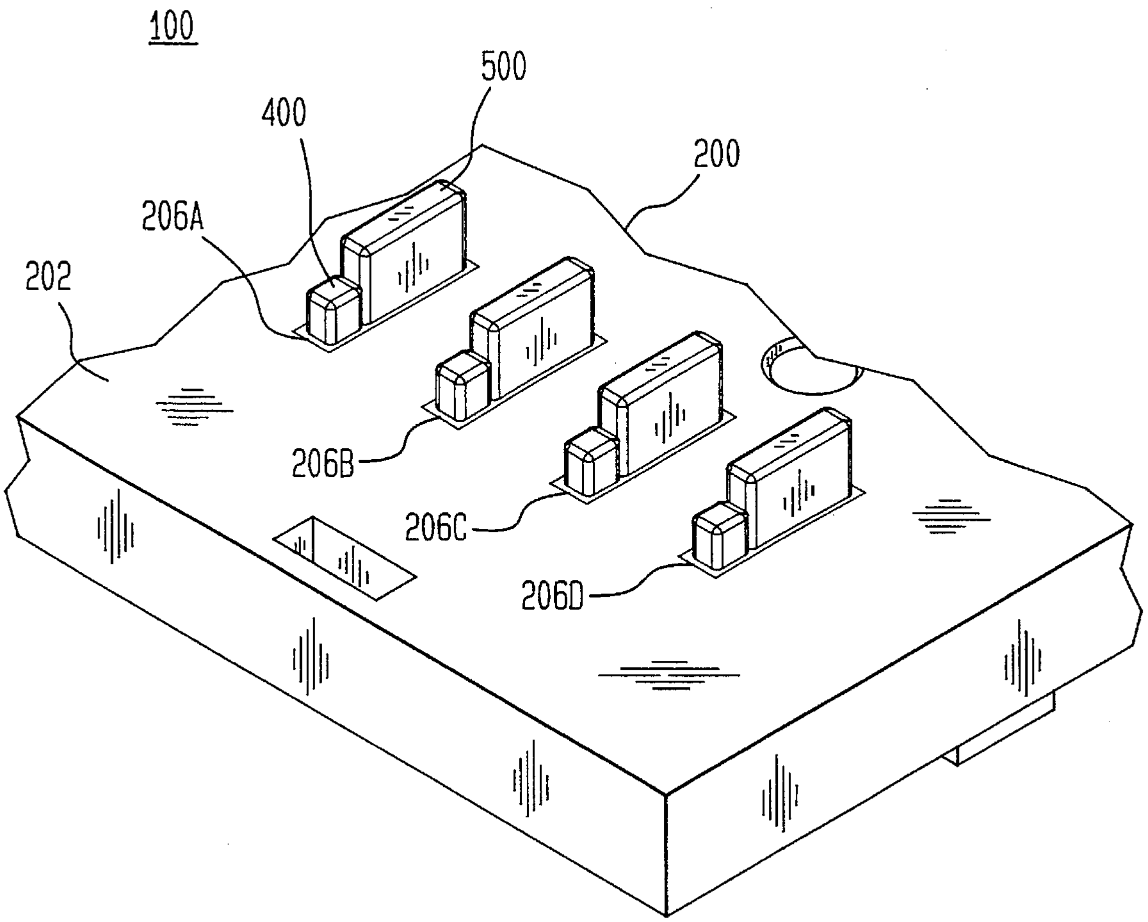
FIG. 1 is a top perspective view of the lighted keyboard system.
Figure 2:
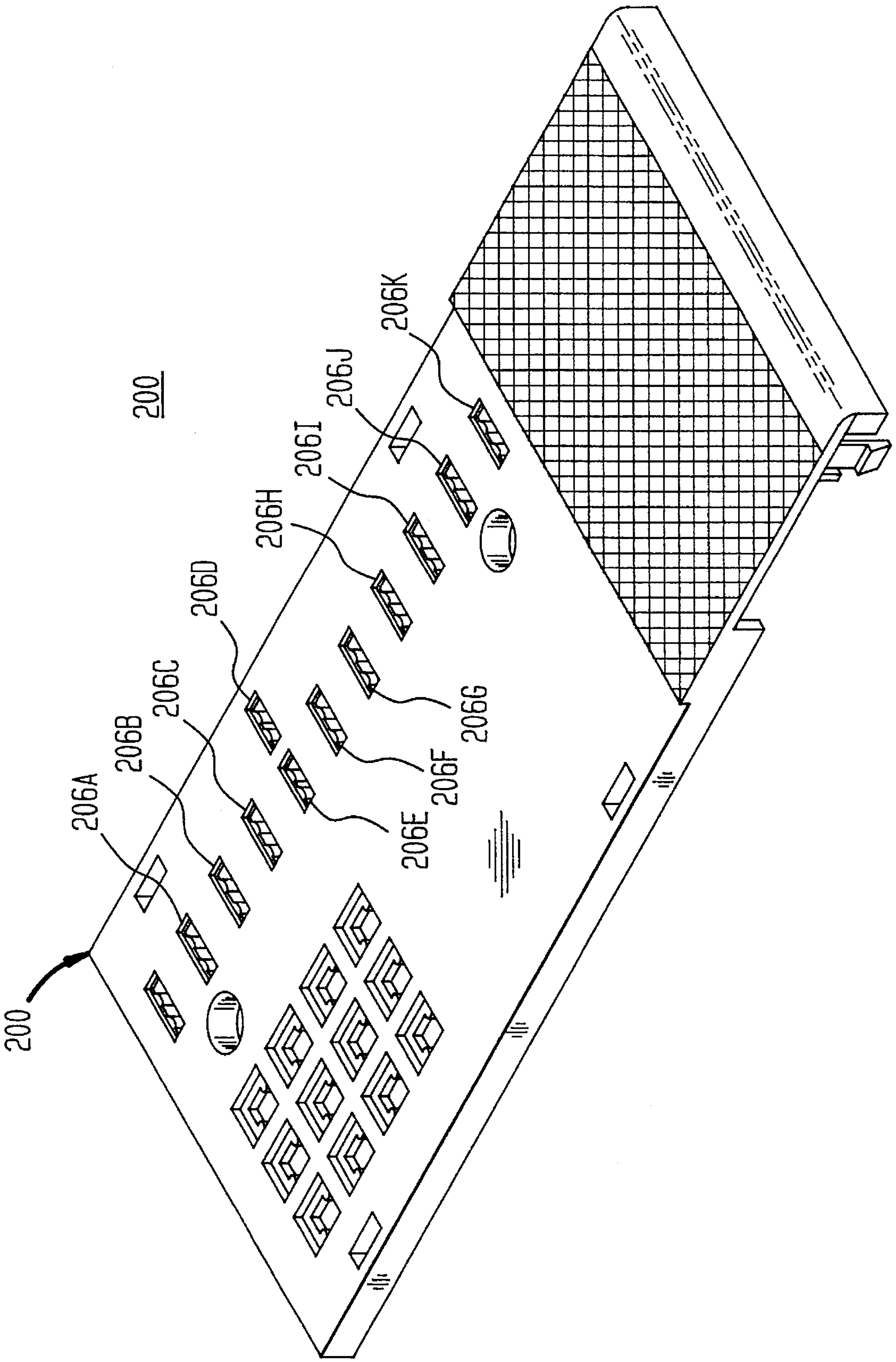
FIG. 2 illustrates a typical keyboard used in the preferred embodiment of the present invention.

Referring to FIG. 1, a perspective view of a keyboard having a number of lighted keyboard systems 100 is illustrated. System 100 is comprised of a function key 500, a corresponding lightpipe 400, and a guiding mechanism (not shown). Both the function key 500 and the lightpipe 400 are supported by a single guiding mechanism (not shown) below the upper surface 202 of a keyboard 200. The function key 500 and the lightpipe 400 extend through a single slot 206 in keyboard 200. FIG. 1 illustrates a portion of the keyboard 200 which is used in the preferred embodiment of the present invention. FIG. 2 illustrates the complete keyboard 200. Keyboard 200 can support a large number of lighted keyboard systems 100. Keyboard 200 is a part of a Rolm telephone system model 66106, manufactured by Rolm Systems, Austin, Tex. However, one should know that the present invention may be used in any type of device having a surface which can support the present invention. Keyboard

200 contains a multiple number of slots 206A through 206K (collectively and generally referred to as 206), penetrating the upper surface 202 of keyboard 200. The limitations to the number of lighted keyboard systems 100 which may be supported by keyboard 200 are (1) the amount of space available on the lower surface of the keyboard 200 to house the support mechanisms and (2) the configuration of the circuit board with which this invention will operate.

Figure 3:
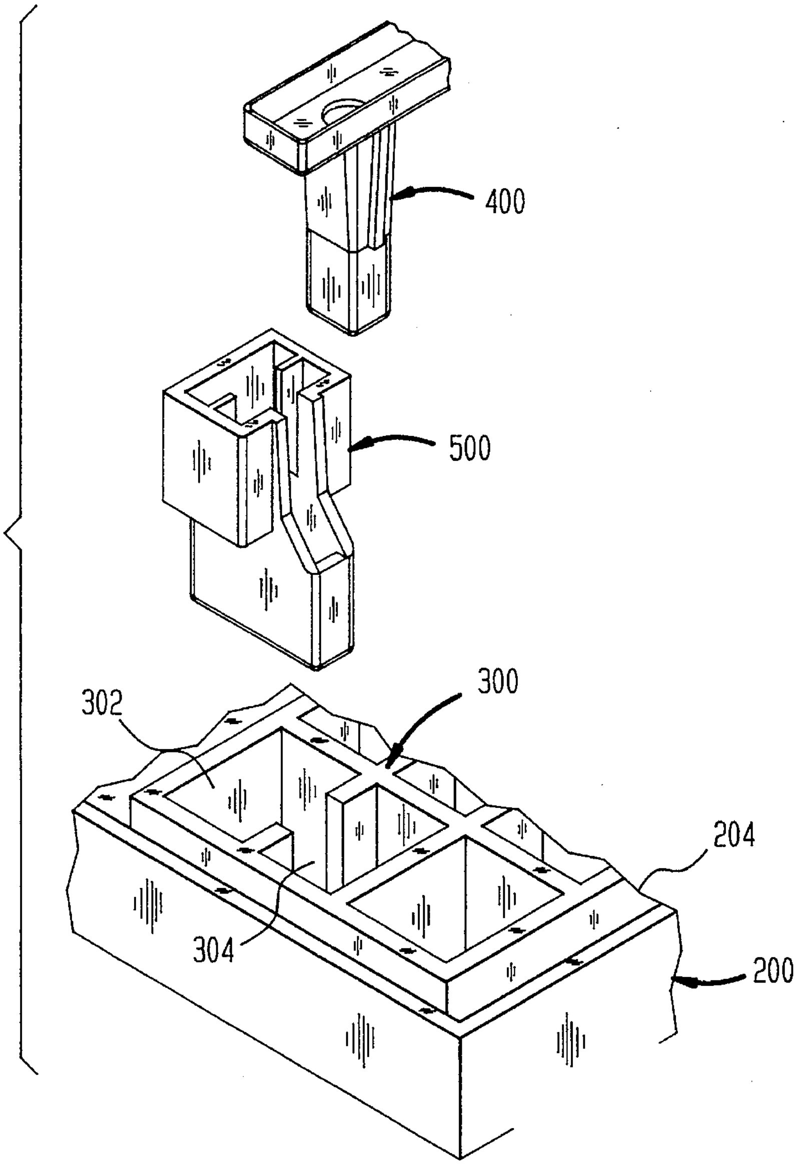
FIG. 3 is an exploded view of the lighted keyboard system.
Figure 4:
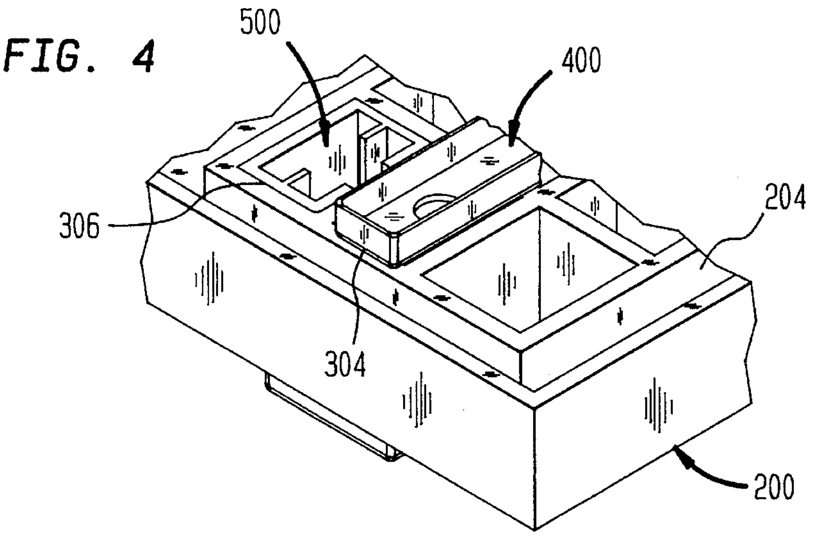
FIG. 4 is a bottom perspective view of the guiding mechanism with the function key and lightpipe installed.

FIG. 3 is an exploded view of the preferred embodiment of the present invention. Guiding mechanism 300 is attached to the lower surface 204 of keyboard 200. The guiding mechanism 300 has two sections: a key guide 302 for guiding the function key 500 and a lightpipe support structure 304 for securing the lightpipe 400. In the preferred embodiment of the present invention, the lightpipe support structure 304 also prevents extraneous light from entering the lightpipe 400. FIG. 4 is the same perspective as FIG. 3, illustrating the function key 500 and the lightpipe 400 inserted into guiding mechanism 300. Function key 500 is completely inserted into the key guide 302 while the bottom of lightpipe 400 remains outside of the lightpipe support structure 304 when the lightpipe 400 is fully inserted. Having a single structure to support and guide the function key 500 and the lightpipe 400 enables the two devices to be positioned adjacent to each other. This completely eliminates the lost space between the function key 500 and lightpipe 400. There is no longer a problem with associating a lightpipe with its corresponding function key, thereby eliminating the need for additional markings or labeling. Also, supporting both devices in a single guiding mechanism 300 reduces the amount of overall space dedicated to each set of devices. This increases the amount of devices a given keyboard can support.

Key Guide

Figure 5:
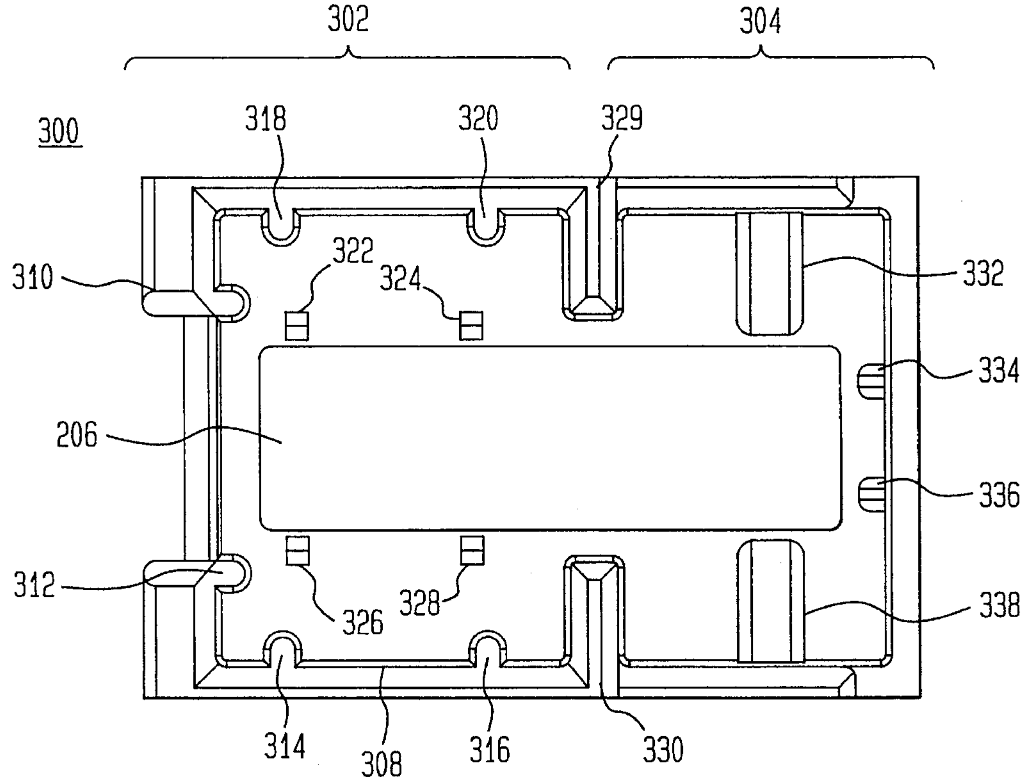
FIG. 5 is a bottom perspective view of the guiding mechanism.

FIG. 5 is a bottom perspective view of guiding mechanism 300. Key guide 302 is the section of guiding mechanism 300 which supports and guides function key 500. Key guide 302 has an inner surface 308 which contains a number of guide bars 310 through 320. These guide bars make contact with the base of function key 500 as function key 500 travels through the key guide 302. The use of contact bars 310 through 320 rather than using the walls of key guide 302 to guide the function key 500 reduces the amount of surface contact made between the function key 500 and the key guide 302. This minimizes the amount of contact friction and rattling generated by the operation of the function key 500. Contact friction is the friction generated between the function key 500 and key guide 302. Rattling is the noise generated by the surfaces of the function key 500 and key guide 302 hitting and rubbing against each other. The reduced friction prevents the function key 500 from easily sticking to the key guide 302. On the lower surface 202 of keyboard 200 are four raised contact points 322, 324, 326, and 328 surrounding slot 206 within key guide 302. Raised contact points 322 through 328 come into contact the function key 500 when the function key 500 is in a fully raised position. Having just four points of contact rather than the whole surfaces contacting each other reduces the rattling which would normally occur when operating function key 500.

Key guide 302 has a common wall with lightpipe support structure 304. This common wall is divided into two sections 329 and 330, separated by slot 206. Lightpipe support structure 304 securely supports the lightpipe 400. The lightpipe support structure 304 has sloped sections 332 through

338 to facilitate the insertion of lightpipe 400 into slot 302 during manufacturing. The lightpipe 400 is constrained on three sides by slot 302 in the upper surface 202 of keyboard 200 that it shares with its corresponding function key 500. The fourth side of lightpipe 400 is constrained by the side of function key 500 which faces lightpipe 400.

Lightpipe

Figure 6:
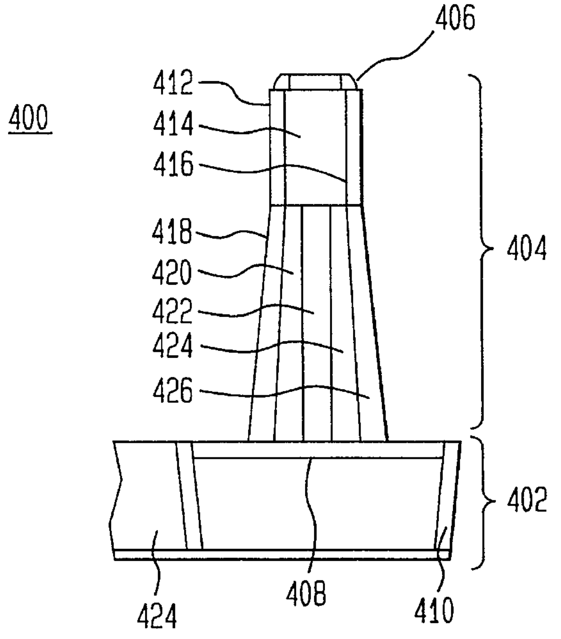
FIG. 6 is a front view of the lightpipe.

Referring to FIG. 6, the lightpipe 400 has three main sections: collector 402 which gathers the light emitted by an external light source, center pipe 404 which directs the light received by the collector 402 up through the upper surface 202 of keyboard 200, and emitter 406 which diffuses and emits the light. Lightpipe 400 is securely held in light supporting structure 304 with the collector 402 approximately centered over the external light source. The center pipe 404 is connected to the collector 402 and extends through the upper surface 202 of keyboard 200. Emitter 406 is connected to the top of center pipe 404 and is therefore positioned above the upper surface 202 of keyboard 200.

Figure 7:
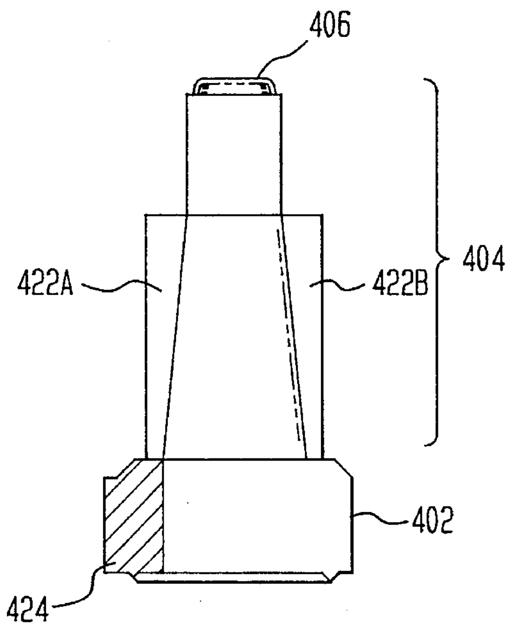
FIG. 7 is a cross-sectional view of the lightpipe taken along line B—B of FIG. 8.

Collector 402 has a light receiving surface 408 which captures the light emitted from the external light source below. A retaining wall 410 extends around the perimeter of the light receiving surface 408. Retaining wall 410 completely surrounds the light receiving surface 408 and extends down toward the light source which emits light at a wide viewing angle. Having the light receiving surface 408 in a single plane surrounded by retaining walls 410 enables collector 402 to capture the majority of light emitted from the light source and minimizes the amount of extraneous light entering the center pipe 404. The center pipe 404 then focuses the wide-angled light received from collector 402 and directs it as a narrow beam of light through the center pipe 404 towards the emitter 406 by internally reflecting the light against the walls of the lightpipe. Walls 412 through 420, 423, and 426 internally reflect the light. As shown in FIG. 7, lightpipe 400 has an arm 422 which, in FIG. 6, appears as another wall.

Emitter 406 is textured with a matte finish applied by electrostatic discharge machining (EDM). This finish diffuses the narrow beam of light, enabling the emitter 406 to emit light which has a wide viewing angle. This creates a uniformly brilliant rectangle that is visible from any position.

Lightpipe 400 is made of Rohm & Hass optically clear acrylic, Model VM100, manufactured by Rohm & Hass, Louisville, Ky. USA.

Referring to FIG. 7, lightpipe 400 has arms 422A and 422B (collectively and generally referred to as 422) on each side of center pipe 404. As shown in FIG. 3, the single guiding mechanism 300 holds both the lightpipe 400 and the function key 500. This enables the lightpipe arm 422 to extend towards the function key 500, positioned between walls 329 and 330, shown in FIG. 5. Arm 422B serves as a stop for function key 500, preventing the function key 500 from traveling too far and causing damage to the circuit board.

Figure 8:
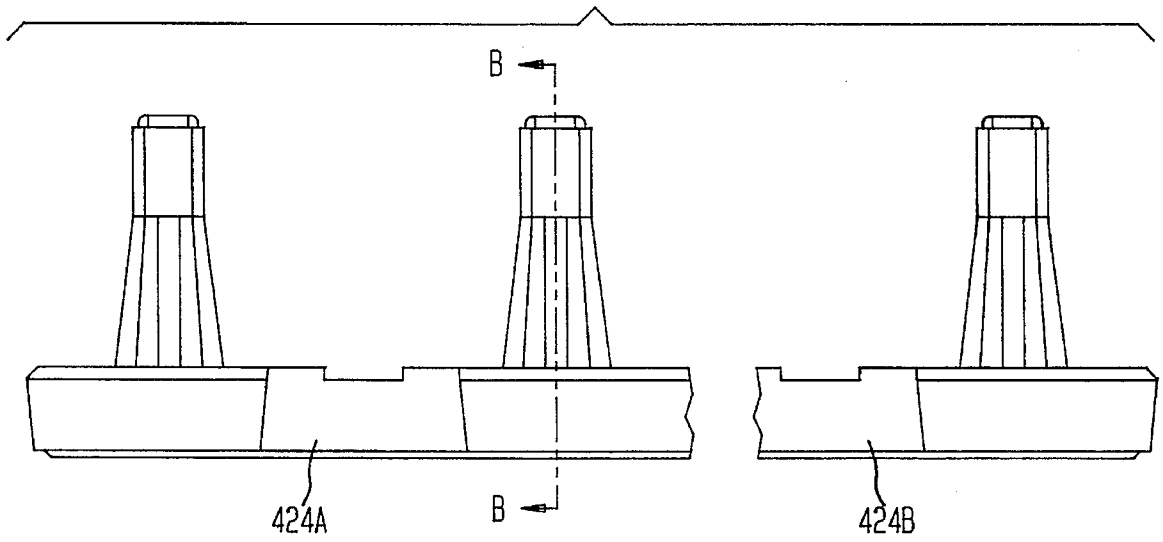
FIG. 8 is a front view of a multiple lightpipe unit.

Lightpipe 400 can be connected to other lightpipes to form a single piece containing as many lightpipes as required for a particular application. FIG. 8 illustrates a series of lightpipes 400 connected by tie bars 424A and 422B (collectively and generally referred to as 424). FIG. 7 illustrates the narrow cross-section of tie bar 424. This narrow cross-section prevents the light captured by collector 402 from traveling through the tie bar to the collector of a neighboring lightpipe.

The center pipe 404 of lightpipe 400 extends through the upper surface 202 of keyboard 200 as illustrated in FIG. 1. This raises the emitter 406 above the upper surface 202, enabling the light emitted from emitter 406 to be seen from any position around the keyboard. This conversion, coupled with the emitter 406 emitting the light with a wide viewing angle, prevents associated function key 500 from blocking the view of the emitted light.

Function Key

Figure 9:
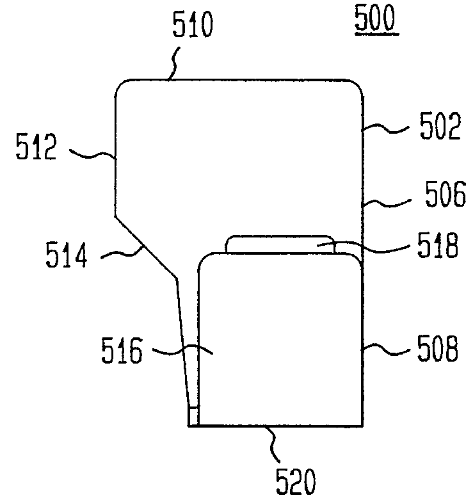
FIG. 9 is a side perspective view of the function key.
Figure 10:
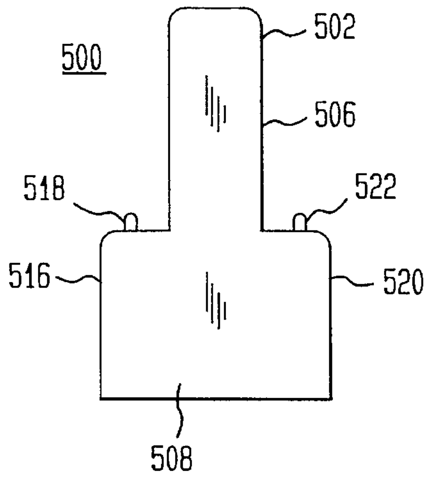
FIG. 10 is a rear perspective view of the function key.

FIGS. 9 and 10 are a side and rear views of function key 500, respectively. Function key 500 has three main sections. Button 502 which extends above the upper surface 202 of keyboard 200, intermediate section 506 connected to button 502, and base 508 which is connected to the intermediate section and interfaces with a key Tpad dome on the circuit board.

Button 502 has a surface 510 which is pressed by the user to activate the function associated with function key 500. Button 502 extends beyond the base 508 on a side which is adjacent to the lightpipe 400. This shifts the key push center of the function key 500 to a point which is not directly above the base 508.

Intermediate section 506 has a sloped surface 514 which extends down from side 512 as shown in FIG. 9. Surface 514 forms an extension which contacts the arm 422 of lightpipe 400 when the function key 500 travels in a downward direction. This prevents the function key 500 from extending too far against the dome of the key Tpad.

The base 508 has a shoulder region 516 on one side and 520 on the opposite side of function key 500. Shoulder regions 516 and 520 have contact bars 518 and 522 on their top surface, respectively. When function key 500 is in the fully extended position, contact bars 518 and 522 contact the lower surface 204 of the keyboard 200. The base is substantially wider than the intermediate section 506 and button 502. This enables the function key to move smoothly within key guide 302 irrespective of where the user applies pressure on surface 510.

In the preferred embodiment of the present invention, function key 500 is made of acrylonitrile butadiene-styrene (ABS). In particular, Cycolac-T, manufactured by General Electric Co., Parkerville, W. Va. USA, is used in the preferred embodiment. However, one should know that any plastic suitable for the environment in which the function key 500 is to operate is sufficient.

Figure 11:
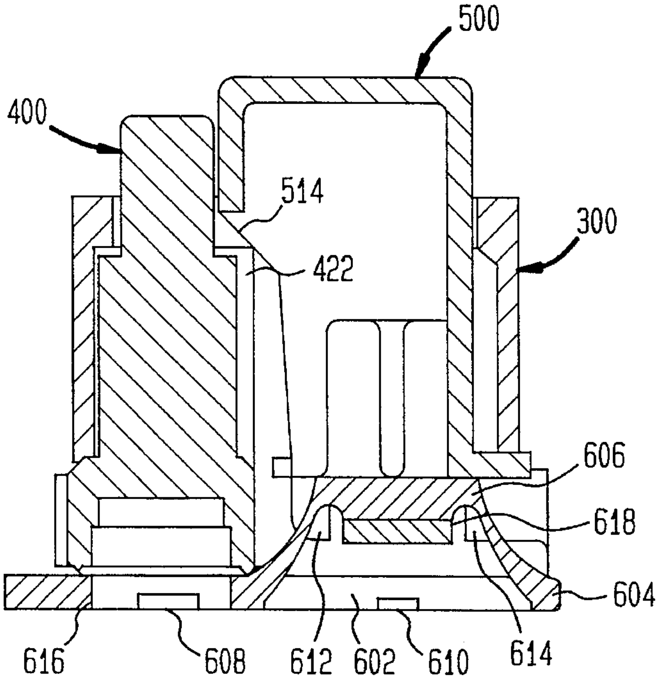
FIG. 11 illustrates the preferred embodiment of the present invention working in conjunction with circuit board components.

FIG. 11 illustrates the lighted keyboard system 100 assembled with circuit board 602. System 100 works in conjunction with circuit board 602 and its components. In particular, the two components associated with the present invention on circuit board 602 are switch 610 and light emitting diode (LED) 608. FIG. 11 illustrates the function key 500 in its depressed position.

The circuit board 602 is covered by a rubberized key pad 604. The lighted keyboard system 100 interfaces with circuit board 602 through this key pad 604. Key pad 604 has a dome 606 covering switch 610. This dome contains a conductive surface 618 on the side which faces switch 610. As illustrated, when function key 500 is moved in a downward position, it flexes the dome 606 causing the conductive surface 618 to connect contacts 612 and 614 of switch 610. Surface 514 of function key 500 is in contact with ann 422 of lightpipe 400.

Lightpipe 400 is positioned over LED 608. The key pad 604 has an opening 616 through which the light emitted from LED 608 leaves circuit board 602 and enters lightpipe 400. The preferred embodiment of the present invention is used with an LED. However, one should know that any external light source may be used with the present invention. When system 100 is assembled with circuit board 602, lightpipe 400 is securely held in place in lightpipe support structure 304, and extends above the upper surface 202 of keyboard 200.

While the invention has been particularly shown and described with reference to a preferred embodiment thereof, it will be understood by those skilled in the art that various changes in form and details may be made therein without departing from the spirit and scope of the invention.

We claim:

1. A lighted keyboard system for use in conjunction with a circuit board having a contact-activated switch and a light source, said lighted keyboard system comprising:

a keyboard having an upper surface and a lower surface and a slot therethrough, said upper surface being accessible to a user;

a function key extending through said slot in said keyboard and positioned above the switch, wherein said function key comprises a button region; an intermediate section; and a base region, wherein said button region is disposed at an end of said function key deployed for access by a user, said base region is disposed at an opposite end of said function key and said intermediate section is disposed between said button region and said base region, and said base region having a bottom surface for contacting said switch and two shoulder regions each having a lower surface that forms a substantial part of said bottom surface, said shoulder regions functioning to widen the bottom surface thereby increasing surface area contact with said switch;

a key guide extending from said lower surface of said keyboard for slidably retaining said function key, whereby said function key is limited to movement in a single axis; and a lightpipe extending through said slot in said keyboard and positioned adjacent to said function key, said lightpipe having a substantially fixed position relative to said light source, said lightpipe having an emitting section positioned above said upper keyboard surface, and being configured to gather light from said light source and to direct said light towards said emitting section, said emitting section thereby emitting said light above the upper surface of the keyboard.

2. The apparatus of claim 1, wherein said lightpipe further comprises:

a collector having a top surface and a light receiving surface opposite said top surface;

a center pipe connected to said top surface of said collector and having walls which internally reflect light received through said light receiving surface of said collector, said center pipe extending though said slot of said keyboard, whereby light from said light source is received by said light receiving surface and directed up through said center pipe towards said emitting section, said emitting section emitting said light.

3. The apparatus of claim 2, wherein said lightpipe further comprises:

a stop extending from said center pipe to stop excess travel of said function key when the function key is depressed.

4. The apparatus of claim 3, wherein said intermediate section has an extension adjacent to said lightpipe, and wherein said stop comprises a contact surface positioned in axial alignment with said extension of said function key to contact said extension of said function key when said function key travels in a direction along its single axis of movement.

5. The apparatus of claim 4, wherein said key guide comprises:

an inner surface having a plurality of guide bars affixed thereto, said guide bars oriented to said single axis of slidable movement of said function key, said guide bars contacting said function key as the function key travels through the key guide, thereby assuring said single axis slidable movement of said function key.

6. The apparatus of claim 5, wherein said lower surface of said keyboard further comprises:

a plurality of raised contact points contacting at least one of said shoulder regions of said function key to stop the travel of said function key when the function key is in a fully raised position.

7. The apparatus of claim 6, wherein said collector of said lightpipe further comprises:

a retaining wall forming a perimeter around said light receiving surface and extending down towards said light source, to allow the collector to capture the majority of light emitted by the light source.

8. The apparatus of claim 7, wherein each of said shoulder regions further comprise:

a top surface; and a shoulder bar connected to the top surface of each of said shoulder regions, configured to contact said raised contact points when said function key is in a fully raised position.

9. The apparatus of claim 8, wherein said emitting section comprises a surface, a portion of said surface having a textured matte finish, to enable said emitting section to emit light which has a wide viewing angle.

10. The apparatus of claim 9, wherein said bottom surface of said base region is substantially centered over the switch.

11. The apparatus of claim 10, wherein said button region of said function key is offset from said bottom surface of said base region.

12. The apparatus of claim 11, comprising a plurality of lightpipes connected by a plurality of tie bars configured with a narrow cross-section to minimize the reception of light associated with a neighboring lightpipe by said light receiving surface.

13. The apparatus of claim 12, further comprising:

barrier means extending from said lower surface of said keyboard adjacent to said center pipe for preventing extraneous light from entering said lightpipe.

14. The apparatus of claim 13, wherein said barrier means further comprises:

a lightpipe support guide extending from said lower surface of said keyboard to said top surface of said collector.

15. The apparatus of claim 14, wherein said lightpipe is comprised of optically clear acrylic.

16. A lighted keyboard system for use in conjunction with a circuit board having a dome-covered contact-activated switch and a light source, said lighted keyboard system comprising:

a keyboard having an upper surface and a lower surface and a slot therethrough;

a function key extending through said slot in said keyboard and positioned above the dome-covered switch, said function key comprising:

a button region, an intermediate section, and a base region, whereby said button region is disposed at an end of said function key deployed for access by a user, said base region is disposed at an opposite end of said function key and said intermediate section is disposed between said button region and said base region, and said base region having a bottom surface in contact with said dome-covered switch and two shoulder regions each having a lower surface that forms a substantial part of said bottom surface, said shoulder regions functioning to widen the bottom surface thereby increasing surface area contact with said switch;

a key guide extending from said lower surface of said keyboard, said key guide having a plurality of surfaces which contact said function key during function key travel to slidably retain said function key, whereby said function key is limited to movement along a single axis; and a lightpipe configured to emit light above said upper surface of said keyboard, extending through said slot in said keyboard and positioned adjacent to said function key, said lightpipe comprising:

a collector having a top surface and a light receiving surface opposite said top surface;

a center pipe connected to said top surface of said collector and extending through said slot of said keyboard, said center pipe having walls which internally reflect light received through said light receiving surface of said collector;

a stop extending from said center pipe, adjacent to said function key; and an emitting section connected to said center pipe opposite said collector, whereby light emitted from said light source is received by said light receiving surface and directed up through said center pipe towards said emitting section, said emitting section emitting said light.

17. A lighted keyboard system for use in conjunction with a circuit board having a surface, a contact-activated switch, and a light source, said contact-activated switch activated by the application of force to the switch along an axis substantially orthogonal to the surface of the circuit board, said lighted keyboard system comprising:

a keyboard having an upper surface and a lower surface and a slot therethrough;

a function key having a button and extending through said slot in said keyboard, said function key receiving force applied to said button and applying a substantial portion of said applied force to the contact-activated switch along the orthogonal axis;

a key guide extending from said lower surface of said keyboard for slidably retaining said function key, whereby said function key is limited to movement along a single axis; said key guide having a plurality of inner surface walls oriented substantially perpendicular to said upper surface of said keyboard, and a plurality of guide bars affixed to said inner surface walls, said guide bars oriented to said single axis of slidable movement of said function key, each of said guide bars having a guide bar surface oriented substantially parallel to said inner wall to which said guide bar is affixed, for contacting said function key while preventing function key contact with said inner surface walls as the function key travels through the key guide, thereby assuring said single axis slidable movement of said function key, wherein the surface area of said plurality of said guide bar surfaces is substantially less than the surface area of the function key within the key guide thereby minimizing frictional contact between the function key and said guide bar surfaces; and a lightpipe positioned adjacent to the function key for gathering light from the light source and for emitting the gathered light above said upper surface of said keyboard.

* * * * *